United States Patent
Xiao et al.

(10) Patent No.: US 12,149,104 B2
(45) Date of Patent: Nov. 19, 2024

(54) MANAGEMENT METHOD FOR A BATTERY SYSTEM HAVING PARALLEL BATTERY PACKS

(71) Applicants: Microvast GmbH, Frankfurt am Main (DE); Microvast, Inc., Stafford, TX (US); Microvast Power Systems Co., Ltd., Huzhou (CN)

(72) Inventors: Rui Xiao, Frankfurt am Mai (DE); Ying Huang, Huzhou (CN); Donglei Wu, Huzhou (CN)

(73) Assignees: Microvast GmbH, Frankfurt am Main (DE); Microvast, Inc., Stafford, TX (US); Microvast Power Systems Co., Ltd., Huzhou (CN)

( * ) Notice: Subject to any disclaimer, the term of this patent is extended or adjusted under 35 U.S.C. 154(b) by 525 days.

(21) Appl. No.: 17/607,899

(22) PCT Filed: Aug. 19, 2020

(86) PCT No.: PCT/CN2020/109962
§ 371 (c)(1),
(2) Date: Nov. 1, 2021

(87) PCT Pub. No.: WO2022/036580
PCT Pub. Date: Feb. 24, 2022

(65) Prior Publication Data
US 2022/0376518 A1   Nov. 24, 2022

(51) Int. Cl.
*H02J 7/00* (2006.01)
*G01R 31/389* (2019.01)
*G01R 31/396* (2019.01)

(52) U.S. Cl.
CPC .......... *H02J 7/0019* (2013.01); *G01R 31/389* (2019.01); *G01R 31/396* (2019.01); *H02J 7/007186* (2020.01)

(58) Field of Classification Search
CPC ...................................................... H02J 7/0019
(Continued)

(56) References Cited

U.S. PATENT DOCUMENTS 10,608,291 B2 * 3/2020 Junger ................ H01M 10/46
10,938,221 B1 * 3/2021 Tenorio ................ H02J 7/0014
(Continued)

FOREIGN PATENT DOCUMENTS

CN    101777675 A    7/2010
CN    102480141 U    5/2012
(Continued)

OTHER PUBLICATIONS

The extended European search report of EP application No. 20932837.6 issued on Mar. 20, 2023.
(Continued)

*Primary Examiner* — Jerry D Robbins
(74) *Attorney, Agent, or Firm* — Andrew C. Cheng

(57) ABSTRACT

A management method for a battery system having parallel battery packs includes a charging control operation of sequentially closing battery packs having a low voltage value level and completing a charging of the battery packs. The purpose of the present invention is to provide a management method for a battery system having parallel battery packs which is applicable to multiple parallel battery packs being charged in parallel, to solve the technical problems that a safe and stable operation of the entire battery packs cannot be ensured caused by the failure of the battery packs, and excessive current impact may be generated due to an excessive voltage difference among the battery packs.

19 Claims, 4 Drawing Sheets

(58) Field of Classification Search
USPC .......................................................... 320/134
See application file for complete search history.

(56) References Cited

U.S. PATENT DOCUMENTS

| | | | |
|---|---|---|---|
| 11,205,905 B2* | 12/2021 | Park | H01M 10/4207 |
| 11,699,908 B2* | 7/2023 | Chen | H02J 7/0014 |
| | | | 320/112 |
| 2012/0086400 A1* | 4/2012 | White | H02J 7/0016 |
| | | | 320/128 |
| 2018/0072158 A1 | 3/2018 | Yang et al. | |
| 2018/0175770 A1* | 6/2018 | Hellström | H02M 1/14 |
| 2020/0373764 A1* | 11/2020 | Lee | H02J 7/0063 |
| 2020/0389034 A1* | 12/2020 | Hong | G01R 31/36 |
| 2021/0028503 A1* | 1/2021 | Hilligoss | H02M 3/1582 |
| 2022/0224129 A1* | 7/2022 | Liu | H01M 10/425 |
| 2022/0407122 A1* | 12/2022 | Marshall | H02J 7/345 |

FOREIGN PATENT DOCUMENTS

| | | |
|---|---|---|
| CN | 103280854 A | 9/2013 |
| CN | 104106175 A | 10/2014 |
| CN | 108631375 A | 10/2018 |
| CN | 109066922 A | 12/2018 |
| CN | 109525009 A | 3/2019 |
| CN | 208638069 U | 3/2019 |
| CN | 109552096 A | 4/2019 |
| CN | 208890439 U | 5/2019 |
| CN | 110907813 A | 3/2020 |
| CN | 111478387 A | 7/2020 |
| JP | 2002064942 A | 2/2002 |
| WO | 2012143396 A1 | 10/2012 |
| WO | 2018228908 A1 | 12/2018 |
| WO | 2020086973 A1 | 4/2020 |

OTHER PUBLICATIONS

Anonymous, "Contactor" published on Mar. 2, 2012, from the Wikipedia, pp. 1-5, XP093030063.
Anonymous, "Contact Life" published on Apr. 30, 2011, from Art Suppression Technologies, pp. 1-2, XP093030062.
International Search Report of PCT Patent Application No. PCT/CN2020/109962 issued on Mar. 1, 2021.
The search report of CN patent application No. 202080032200.9 issued on May 18, 2024.
The first office action of CN patent application No. 202080032200.9 issued on May 18, 2024.

* cited by examiner

MANAGEMENT METHOD FOR A BATTERY SYSTEM HAVING PARALLEL BATTERY PACKS

CROSS REFERENCE TO RELATED APPLICATIONS

This application is a 35 U.S.C. § 371 National Phase conversion of International (PCT) Patent Application No. PCT/CN2020/109962, filed on Aug. 19, 2020. The contents of the above-identified application are incorporated herein by reference. The PCT International Patent Application was filed in Chinese.

TECHNICAL FIELD

The invention relates to the technical field of battery management, in particular to a management method for parallel batteries.

BACKGROUND

Battery packs include series battery packs and parallel battery packs. Each battery in the parallel battery packs is required to have the same voltage which is also the output voltage, and the parallel battery packs can provide a stronger current. While there is no excessive requirement for series battery packs. With the development of society, the voltage required by the industry becomes higher and higher. In order to solve the problem of power supply voltage of the battery, methods such as series connection and parallel connection for battery packs have be developed, series connection is to increase the voltage of the battery, and parallel connection is to increase the capacity of the battery and the output current.

Technical Problem

When multiple parallel battery packs are charged in parallel, unrecoverable faults such as component damage, battery cell data lost or beyond critical alarm value may occur due to the small internal resistance of the battery, causing the battery packs be out of run, which cannot ensure a safe and stable operation for the entire battery packs. Further, when there is an excessive voltage difference among the battery packs, a larger circulating current will be generated between the battery packs, resulting in an excessive current impact.

Technical Solution

The purpose of the present invention is to provide a management method for parallel battery packs, which is applicable to multiple parallel battery packs being charged in parallel, to solve the technical problems that a safe and stable operation of the entire battery packs cannot be ensured caused by the failure of the battery packs, and excessive current impact may be generated due to an excessive voltage difference among the battery packs.

In order to solve the technical problems, the present invention provides a management method for a battery system having parallel battery packs, including a charging control operation including sequentially closing battery packs having a low voltage value level and completing a charging of the battery packs. The charging control operation includes steps of:

C100, collecting voltage data and status data of each battery pack in real time, closing a switch of the battery pack having a low voltage value level, and maintaining a normal charging current;

C200, keeping a constant voltage and reducing the charging current, if a voltage of a closed battery pack reaches a lowest voltage value of an unclosed battery pack;

C300, closing the unclosed battery pack that is located at the lowest voltage value, and increasing and returning to the normal charging current, if a current value of the system is lower than a preset value Y;

C400, repeating steps C200 to C300 until all battery packs are fully charged;

in step C300, a method for determining the preset value Y includes determining the preset value Y accordingly to a selection of a contactor, namely closing the contactor under an impulse current no greater than the preset value Y, t to still guarantee a life span more than 10,000 times for the contactor.

Preferably, in step C100, the battery packs having the low voltage value level are those located at the lowest voltage value and those located at a certain voltage value having a preset difference value X1 compared with the lowest voltage value.

Preferably, in step C100, the preset difference value X1 is determined by calculating an internal resistance of parallel battery packs, and calculating the preset difference value X1 according to the preset value Y in step C300.

Preferably, a startup control operation is further included to close a switch of a normal battery pack based on data of each battery pack when all battery packs are disconnected, and the startup control operation specifically includes steps of:

A100, disconnecting all battery packs;

A200, collecting voltage data and status data of each battery pack in real time;

A300, closing switches of the battery packs those have no serious faults and have a high voltage value level, according to the voltage data and the status data and the internal resistance.

Preferably, in step A300 of the startup control operation, the serious faults comprise contactor adhesion faults, insulation faults, high-voltage connection faults, serious over-temperature with safety hazards, and CAN communication faults.

Preferably, in step A300 of the startup control operation, the battery packs having the high voltage value level are that located at a highest voltage value and those located at a certain voltage value having a preset difference value X2 compared with the highest voltage value.

Preferably, in step A300, the preset difference value X2 is determined by calculating an internal resistance of parallel battery packs, and calculating the preset difference value X2 according to the preset value Y in the step C300 and the internal resistance.

Preferably, it further includes a running control operation of controlling an output power value of the system according to a fault generated in battery packs until a faulty battery pack is disconnected, and the running control operation includes steps of:

B100, collecting voltage data and status data of each battery pack in real time;

B200, limiting the output power value of the system, if a fault that is unrecoverable automatically occurs on the status data of a certain battery pack;

B300, disconnecting the battery pack and restoring the output power value of the system, if the current value of the system is lower than the preset value Y of step C300.

Preferably, in step B200 of the startup control operation, the fault that is unrecoverable automatically is the fault that affects system safe operation and/or has a serious impact on system performance.

Beneficial Effect

It can be seen from the above that the technical solution provided by the present invention can effectively avoid the impact caused by the voltage difference or the lack of battery packs by individually controlling the parallel battery packs during the charging startup, operation and charging process, and improve the operational efficiency and stability of the system by automatically balancing the system.

BRIEF DESCRIPTION OF THE DRAWINGS

In order to explain the embodiments of the present invention or the technical solutions of the prior art more clearly, the following will briefly introduce the drawings that need to be used in the description of the embodiments or the prior art. Obviously, the drawings in the following description are merely for some of the embodiments of the present invention, people ordinary skill in the art can obtain other drawings based on these drawings without creative work. In such drawings.

DETAILED DESCRIPTION OF PREFERRED EMBODIMENTS

Figure 1:
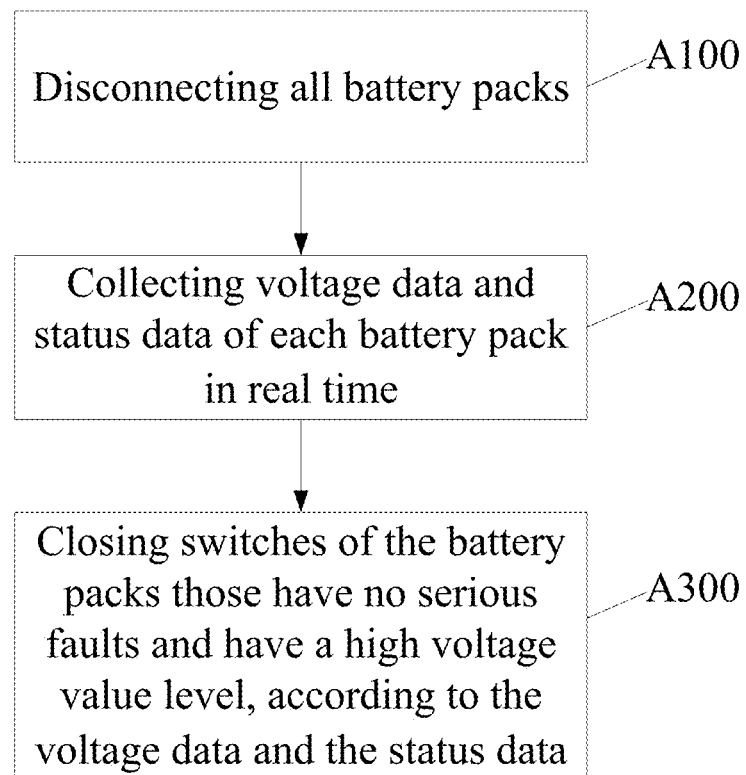
FIG. 1 is a flowchart of startup control operations according to an embodiment of the present invention.
Figure 2:
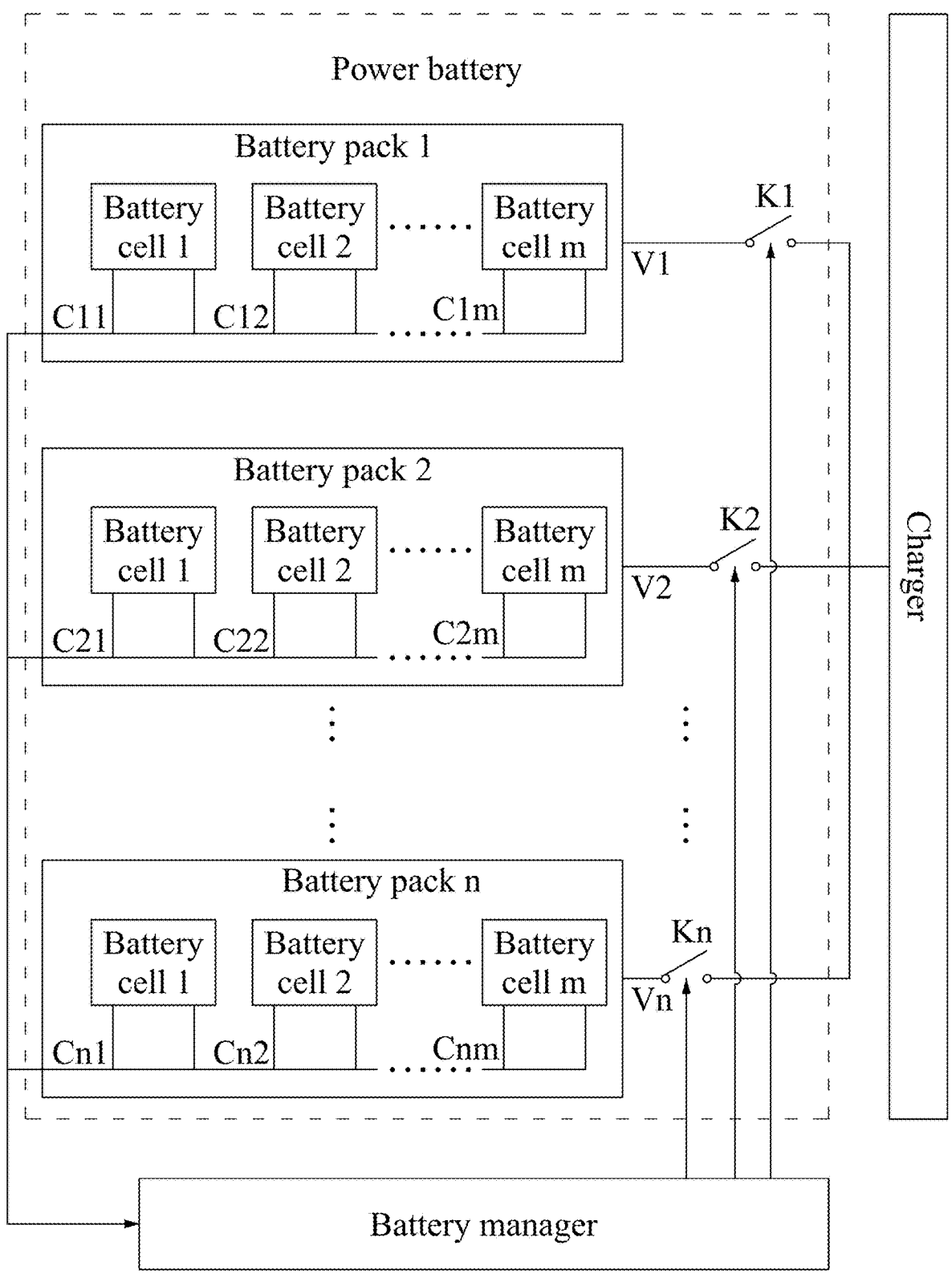
FIG. 2 is a circuit connection diagram of an embodiment of the present invention.

The technical solutions in the embodiments of the present invention will be clearly and completely described below in conjunction with the accompanying drawings in the embodiments of the present invention. Obviously, the described embodiments are only a part of the embodiments of the present invention, rather than all the embodiments. Based on the embodiments of the present invention, all other embodiments obtained by those of ordinary skill in the art without creative work shall fall within the protection scope of t present invention.

In order to explain the technical solutions provided by the embodiments of the present invention, explanations for a BMS system of parallel battery packs will be followed. BMS is short for battery management system, which is a control system to protect the safety of the power battery to alleviate the inconsistency of the battery packs and provide guarantee for the safe use of new energy vehicles by monitoring status of the battery in real time.

The current BMS is applied to multiple parallel battery packs. During the charging process of the parallel battery packs, unrecoverable faults such as component damage, battery cell data lost or beyond critical alarm value may occur due to the small internal resistance of the batteries, causing the battery packs be out of run, which cannot ensure a safe and stable operation for the entire battery packs.

Further, when there is a relatively large voltage difference between the battery packs, a larger circulating current will be generated between the battery packs, resulting in an excessive current impact.

In order to solve the above technical problems, the present embodiment provides a management method for a battery system having parallel battery packs, which relates to the technical field of battery system control, and specifically aims at ensuring that the vehicle enters a limp mode to maintain safety and stability when unrecoverable faults occur on the parallel battery system during use, and provide a power supply balance on account of an excessive voltage difference among the battery packs. The management method for a battery system having parallel battery packs is applied to a power battery system including a plurality of battery packs, and each battery pack includes at least one battery cell. Multiple battery packs are connected in parallel at the output end, and a switch is configured between each battery pack and a parallel circuit, so that the parallel connection or disconnection for each battery pack can be individually controlled.

In the management method for a battery system having parallel battery packs provided in this embodiment, during the startup process of the battery packs, a damaged battery pack will not be connected; during the operation process of the battery packs, the power output of the battery system will be limited, and the battery pack will be safely disconnected to make the system enter the limp mode and restore the normal output power according to the number of battery packs; during the charging process, each parallel battery pack can be individually controlled to effectively avoid the impact caused by the voltage difference or the problem of battery pack lack, and improve the operational efficiency and stability of the system by automatically balancing the system.

Therefore, the management method for a battery system having parallel battery packs provided in this embodiment includes a startup control operation, a running control operation, and a charging control operation, with the focus being on the charging control operation.

Figure 4:
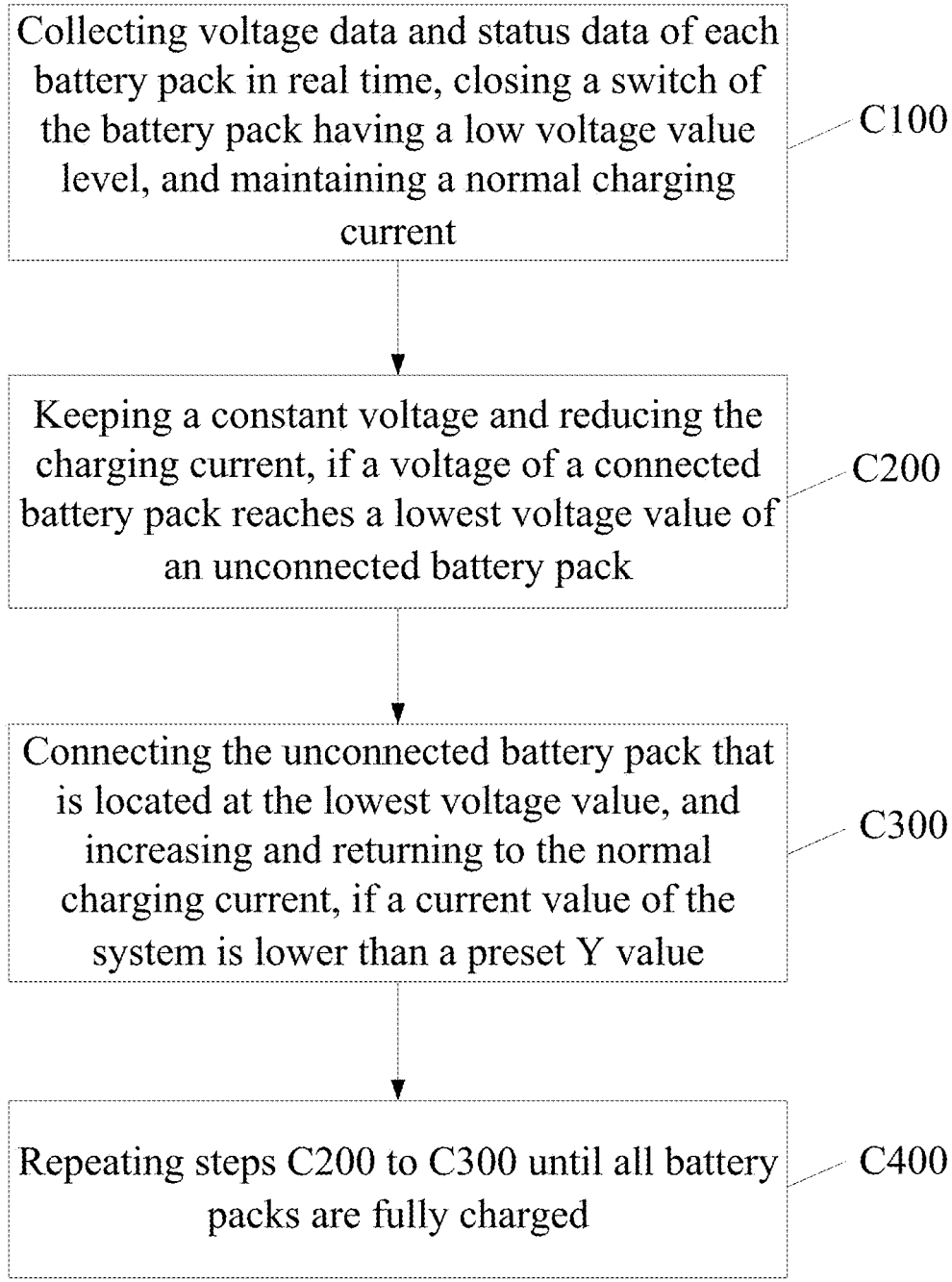
FIG. 4 is a flowchart of charging control operations according to an embodiment of the present invention.

In the charging control operation, battery packs those are located at a low voltage value level will be sequentially closed, and the charging of battery packs is completed. As shown in FIG. 4, the charging control operation specifically includes the following steps:

C100, based on voltage data collected in the step A100, closing a switch of the battery pack located in a low voltage value level, and maintaining a normal charging current;

C200, keeping a constant voltage and reducing the chagrining current, if a voltage of the battery pack that has been closed reaches a lowest voltage value of an unclosed battery pack;

C300, closing the unclosed battery pack that is located at the lowest voltage value, and increasing and returning to the normal charging current, if a current value of the system is lower than a preset Y value;

C400, repeating the steps C200 to C300 until all battery packs are fully charged.

In the step C100, the battery packs with the low voltage value level are those located at the lowest voltage value and located at a certain voltage value having a preset difference value X1 compared with the lowest voltage value.

For the battery packs that are located at a certain voltage value having a preset difference value X1 compared with the lowest voltage value, the difference value X1 is designed according to the system voltage, the internal resistance of the battery packs and the specifications of related electrical components, that is, any current caused by the voltage difference value X1 has to make no any impact on the safety performance of the system when the related battery packs are connected in parallel. Specifically, the difference value X1 is determined through experiments as follows. When the battery packs are connected in parallel, a current value generated is calculated according to the existing voltage difference X1 and the internal resistance of the parallel battery packs. The current value has to make no impact on the safety of the system or the life expectancy of the system hardware (especially the contactors). The difference value X1 may be selected within a range determined by the calculation, that is, a certain voltage difference between packs is allowed while ensuring the safety performance of the system. The calculation process includes calculating the internal resistance of the parallel battery packs, and calculating the value X1 according to the preset value in the step C300 and the internal resistance.

In the actual determination process, the value X1 needs to be calculated and determined according to the electrical characteristics of the system, such as the system voltage, the internal resistance of the battery packs, and the specifications of related electrical components, that is, a current caused by the voltage difference X1 has to make no any impact on the safety performance of the system when the related battery packs are connected in parallel. That's the reason why the value X1 must be determined through experiments.

In the step C200, constant voltage charging means that, when the charging voltage just reaches the target voltage value, the actual cell voltage is still lower than the target voltage value; at this time, the charging current is large, and the constant voltage charging needs to be maintained, and the actual cell voltage gradually approaches the target voltage value, thus the charging current gradually becomes smaller for the next step of parallel connection.

It should be noted that the constant voltage charging in the step C200 means that, the voltage of the battery pack being charged is kept unchanged, and then the charging current is controlled to be reduced to the preset value Y determined in the step C300, so as to close the unconnected battery packs with the same voltage, and the battery packs are then restored to normal charging current. Such a process is repeated until all battery packs in the system are closed.

For example, supposed that three battery packs with different voltages are included in the system, wherein battery pack A has the lowest voltage, battery pack B has the intermediate voltage, and battery pack C has the highest voltage. When balance charging is started, firstly the battery pack A is closed to charge. Once the voltage of the battery pack A reaches the voltage of the battery pack B, the current voltage of the battery pack A is maintained to be constant, and its charging current is reduced (because the voltage of the battery pack A is measured at a certain current, which does not represent its true voltage. If the current decreases too fast, the voltage value will decrease). Once the current value is lower than the preset value Y determined in the step C300, the battery pack B is closed, and then the charging current is restored accordingly. Because the battery pack A and the battery pack B are connected in parallel, the voltage of the battery pack A is equal to that of the battery pack B after the balance charging; once the voltage of the battery pack A or the battery pack B reaches the voltage of the battery pack C, the above process is repeated so as to connect with the battery pack C.

Therefore, if N different voltages with an ascending order of $N_0 \ldots N_n$ are included in the system, process of firstly constant current charging then constant voltage charging, for (N−1) times will be performed. The initial voltage of constant voltage charging is $N_1$, and the cut-off current of constant voltage charging is the preset value Y determined in the step C300. After each constant voltage charging is finished, the target voltage of the next constant current and constant voltage charging shall be increased by one level $(N_{1+1})$.

It should be noted that the above charging process can also perform constant current charging first, which is not mandatory. There are no strict regulations on this process. For example, if the charging current is relatively large at the beginning, and the current will possibly be reduced due to the temperature or SOC. Note that, constant voltage charging process will be started once the voltage of the rechargeable battery pack is the same as that of the battery pack to be connected.

In the step C300, the method for determining the preset value Y includes determining the preset value Y in the step C300 according to the selection of the contactor, namely closing the contactor under an impulse current no greater than the preset value, to still guarantee a life span more than 10,000 times for the contactor. The maximum charging current of the BMS system needs to be designed according to the system voltage and the specifications of related electrical components, especially the contactors. That is, when any one battery pack of the parallel battery packs is closed, the existing ampere current Y will not have any effect or will have only negligible effect on the safety performance of the system. The value Y is determined through experiments and determined according to the characteristics of the system, and the charging current can be appropriately increased according to the number of battery packs connected in parallel. The value Y can be selected in a certain range, that is, a certain system current is allowed when the battery packs are disconnected, so that the system can continue to operate, and at the same time the safety of system components can be ensured.

The preset value is an adjustable parameter in the BMS software, which is an impulse current calculated by the internal resistance of the battery packs according to the maximum allowable impulse current of the contactor, and determined by the impact of mutual charging on the battery life caused by the voltage difference between the batteries connected in parallel. It's necessary that the impulse current calculated by the battery packs is smaller than the maximum allowable impulse current of the contactor, and meanwhile smaller than the maximum allowable value of the impact of charging and discharging on the battery life of the parallel battery packs. At the same time, it is necessary to consider whether a pre-charging circuit is configured in the battery packs. If yes, it is also necessary to consider whether the maximum pre-charging energy of the pre-charging circuit is exceeded due to the excessive voltage difference.

In the step C400, all battery packs will be connected in parallel once they reach to a balanced voltage. At this time, a balance charge of the multiple-pack parallel battery system is completed, and the charging process may be stopped accordingly, or continued until the system is fully charged (normal charged).

There are no restrictions on the charging manner for the newly connected batteries and previously added batteries. The BMS will calculate the current limit in real time based on the parallel battery packs. In the startup control operation, when all the battery packs are disconnected, the switch of the normal battery pack can be closed through the data of each battery pack. After completing this step, the device to which the battery packs are applied enters a "limp" mode. As shown in FIG. 1, the method specifically includes the following steps:

A100, disconnecting all battery packs;

A200, collecting voltage data and status data of each battery pack in real time;

A300, closing switches of the battery packs those have no serious faults and have a high voltage value level, according to the voltage data and the status data.

In the step A300, the battery pack to be closed needs to meet either of two conditions, as follows:

The switch of the battery pack has no serious faults and has the highest voltage value; or The switch of the battery pack has no serious faults and has a voltage difference within a certain range compared with the highest voltage value.

Specifically, serious faults include faults that are unrecoverable automatically, such as contactor adhesion faults that affect the safe operation of the system; battery undervoltages that have a serious impact on the system performance. Various types of faults, such as contactor adhesion faults, insulation faults, high-voltage connection faults, serious over-temperature with safety hazards, and CAN communication faults are specifically defined in a list in the BMS system.

For the battery packs that are located at a certain voltage value having a preset difference value X2 compared with the highest voltage value, the difference value X2 is designed according to the system voltage, the internal resistance of the battery packs and the specifications of related electrical components, that is, any current caused by the voltage difference value X2 has to make no any impact on the safety performance of the system when the related battery packs are connected in parallel. Specifically, the difference value X2 is determined through experiments as follows. When the battery packs are connected in parallel, a current value generated is calculated according to the existing voltage difference X2 and the internal resistance of the parallel battery packs. The current value has to make no impact on the safety of the system or the life expectancy of the system hardware (especially the contactors). The difference value X2 may be selected within a range determined by the calculation, that is, a certain voltage difference between packs is allowed while ensuring the safety performance of the system. The calculation process includes calculating the internal resistance of the parallel battery packs, and calculating the value X2 according to the preset value in the step C300 and the internal resistance.

After the battery packs enter the limp mode, the maximum allowable power output by the system is determined according to the actual number of battery packs connected in parallel. Specifically, the maximum allowable power of a single battery pack can be determined according to the cell specification and battery pack arrangement, such as the number of battery cells in parallel and/or in series and the electrical components used. The maximum allowable power output by the system is obtained by multiplying the minimum value in the maximum allowable powers for each single battery pack by the number of parallel battery packs.

Figure 3:
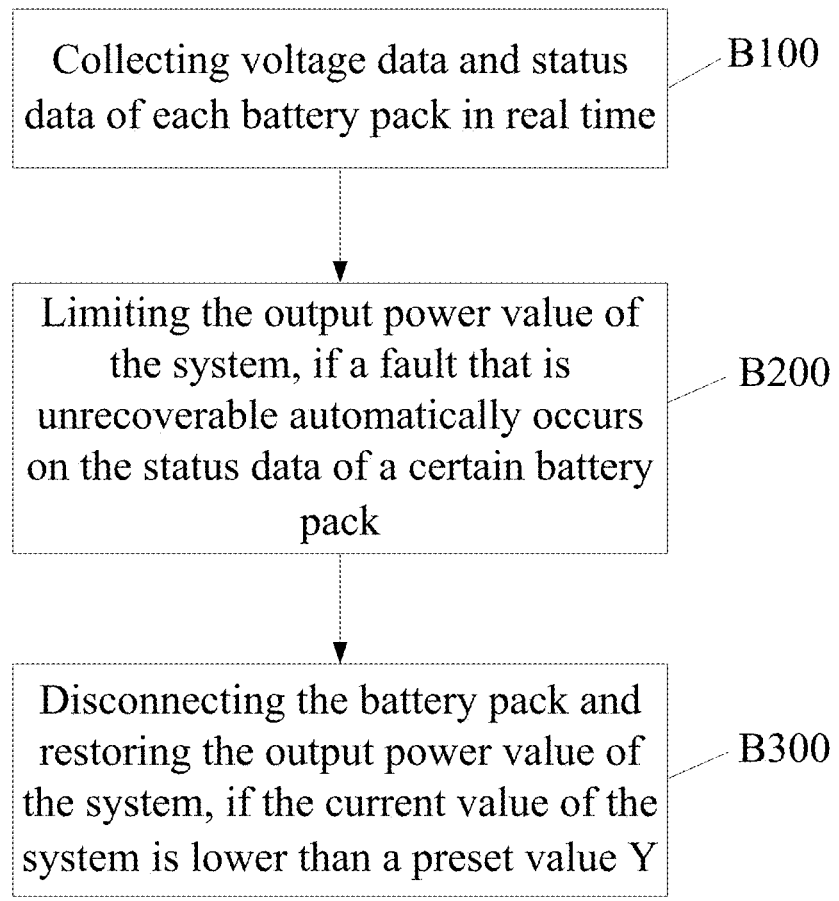
FIG. 3 is a flowchart of running control operations according to an embodiment of the present invention.

In the running control operation, the output power value of the system is controlled according to the fault generated in the battery packs until the faulty battery pack is disconnected. As shown in FIG. 3, following steps are specifically included:

B100, collecting voltage data and status data of each battery pack in real time;

B200, limiting the output power value of the system, if a fault that is unrecoverable automatically occurs on the status data of a certain battery pack;

B300, disconnecting the battery pack and restoring the output power value of the system, if the current value of the system lower than a preset value.

In the step B200, the faults that are unrecoverable automatically are the same as in step the A300 and include faults those affect the safe operation of the system and/or have a serious impact on the system performance.

Based on the preset value in the step B300, the power output limitation will be restored according to the number of battery packs actually connected, and the maximum allowable power output by the system is obtained by multiplying the minimum value in the maximum allowable powers for each single battery pack by the actual number of parallel battery packs.

The above-mentioned embodiments do not constitute a limitation on the protection scope of the technical solution. Any modification, equivalent replacement and improvement made within the spirit and principle of the above-mentioned embodiments shall be included in the protection scope of the technical solution.

What is claimed is:

1. A management method for a battery system having parallel battery packs, comprising a charging control operation including sequentially connecting battery packs having a low voltage value level and completing a charging of the battery packs, the charging control operation comprising steps of:

C100, collecting voltage data and status data of each battery pack in real time, closing a switch of the battery pack having a low voltage value level, and maintaining a normal charging current;

C200, keeping a constant voltage and reducing the charging current, if a voltage of a connected battery pack reaches a lowest voltage value of an unconnected battery pack;

C300, connecting the unconnected battery pack that is located at the lowest voltage value, and increasing and returning to the normal charging current, if a current value of the system is lower than a preset value Y;

C400, repeating steps C200 to C300 until all battery packs are fully charged;

in step C300, a method for determining the preset value Y comprising determining the preset value Y accordingly to a selection of a contactor, namely closing the contactor under an impulse current no greater than the preset value Y, to still guarantee a life span more than 10,000 times for the contactor.

2. The management method of claim 1, wherein in step C100, the battery packs having the low voltage value level are those located at the lowest voltage value and located at a certain voltage value having a preset difference value X1 compared with the lowest voltage value.

3. The management method of claim 2, wherein in step C100, the preset difference value X1 is determined by calculating an internal resistance of parallel battery packs, and calculating the preset difference value X1 according to the preset value Y in step C300 and the internal resistance.

4. The management method of claim 3, further comprising a startup control operation including closing a switch of a normal battery pack based on data of each battery pack when all battery packs are disconnected, and the startup control operation comprising steps of:

A100, disconnecting all battery packs;

A200, collecting voltage data and status data of each battery pack in real time;

A300, closing switches of the battery packs those have no serious faults and have a high voltage value level, according to the voltage data and the status data.

5. The management method of claim 4, wherein in step A300 of the startup control operation, the serious faults comprise contactor adhesion faults, insulation faults, high-voltage connection faults, serious over-temperature with safety hazards, and CAN communication faults.

6. The management method of claim 4, wherein in step A300 of the startup control operation, the battery packs having the high voltage value level are those located at a highest voltage value and located at a certain voltage value having a preset difference value X2 compared with the highest voltage value; in step A300, the preset difference value X2 is determined by calculating an internal resistance of parallel battery packs, and calculating the preset difference value X2 according to the preset value Y in step C300 and the internal resistance.

7. The management method of claim 3, further comprising a running control operation of controlling an output power value of the system according to a fault generated in battery packs until a faulty battery pack is disconnected; and the running control operation comprising steps of:

B100, collecting voltage data and status data of each battery pack in real time;

B200, limiting the output power value of the system, if a fault that is unrecoverable automatically occurs on the status data of a certain battery pack;

B300, disconnecting the battery pack and restoring the output power value of the system, if the system current value is lower than the preset value Y of step C300.

8. The management method of claim 7, wherein in step B200 of the startup control operation, the fault that is unrecoverable automatically is the fault that affects system safe operation and/or has a serious impact on system performance.

9. The management method of claim 2, further comprising a startup control operation including closing a switch of a normal battery pack based on data of each battery pack when all battery packs are disconnected, and the startup control operation comprising steps of:

A100, disconnecting all battery packs;

A200, collecting voltage data and status data of each battery pack in real time;

A300, closing switches of the battery packs those have no serious faults and have a high voltage value level, according to the voltage data and the status data.

10. The management method of claim 9, wherein in step A300 of the startup control operation, the serious faults comprise contactor adhesion faults, insulation faults, high-voltage connection faults, serious over-temperature with safety hazards, and CAN communication faults.

11. The management method of claim 9, wherein in step A300 of the startup control operation, the battery packs having the high voltage value level are those located at a highest voltage value and located at a certain voltage value having a preset difference value X2 compared with the highest voltage value; in step A300, the preset difference value X2 is determined by calculating an internal resistance of parallel battery packs, and calculating the preset difference value X2 according to the preset value Y in step C300 and the internal resistance.

12. The management method of claim 2, further comprising a running control operation of controlling an output power value of the system according to a fault generated in battery packs until a faulty battery pack is disconnected; and the running control operation comprising steps of:

B100, collecting voltage data and status data of each battery pack in real time;

B200, limiting the output power value of the system, if a fault that is unrecoverable automatically occurs on the status data of a certain battery pack;

B300, disconnecting the battery pack and restoring the output power value of the system, if the system current value is lower than the preset value Y of step C300.

13. The management method of claim 12, wherein in step B200 of the startup control operation, the fault that is unrecoverable automatically is the fault that affects system safe operation and/or has a serious impact on system performance.

14. The management method of claim 1, further comprising a startup control operation including closing a switch of a normal battery pack based on data of each battery pack when all battery packs are disconnected, and the startup control operation comprising steps of:

A100, disconnecting all battery packs;

A200, collecting voltage data and status data of each battery pack in real time;

A300, closing switches of the battery packs those have no serious faults and have a high voltage value level, according to the voltage data and the status data.

15. The management method of claim 14, wherein in step A300 of the startup control operation, the serious faults comprise contactor adhesion faults, insulation faults, high-voltage connection faults, serious over-temperature with safety hazards, and CAN communication faults.

16. The management method of claim 14, wherein in step A300 of the startup control operation, the battery packs having the high voltage value level are those located at a highest voltage value and located at a certain voltage value having a preset difference value X2 compared with the highest voltage value.

17. The management method of claim 16, wherein in step A300, the preset difference value X2 is determined by calculating an internal resistance of parallel battery packs, and calculating the preset difference value X2 according to the preset value Y in step C300 and the internal resistance.

18. The management method of claim 1, further comprising a running control operation of controlling an output power value of the system according to a fault generated in battery packs until a faulty battery pack is disconnected; and the running control operation comprising steps of:

B100, collecting voltage data and status data of each battery pack in real time;

B200, limiting the output power value of the system, if a fault that is unrecoverable automatically occurs on the status data of a certain battery pack;

B300, disconnecting the battery pack and restoring the output power value of the system, if the current value of the system is lower than the preset value Y of step C300.

19. The management method of claim 18, wherein in step B200 of the startup control operation, the fault that is unrecoverable automatically is the fault that affects system safe operation and/or has a serious impact on system performance.

* * * * *